US010355006B2

(12) United States Patent
Fujitsuka et al.

(10) Patent No.: US 10,355,006 B2
(45) Date of Patent: Jul. 16, 2019

(54) SEMICONDUCTOR STORAGE DEVICE AND MANUFACTURING METHOD THEREOF

(71) Applicant: TOSHIBA MEMORY CORPORATION, Minato-ku (JP)

(72) Inventors: Ryota Fujitsuka, Yokkaichi (JP); Nobuhito Kuge, Yokkaichi (JP); Kensei Takahashi, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/000,646

(22) Filed: Jan. 19, 2016

(65) Prior Publication Data

US 2017/0069534 A1    Mar. 9, 2017

Related U.S. Application Data

(60) Provisional application No. 62/215,496, filed on Sep. 8, 2015.

(51) Int. Cl.
*H01L 27/11524* (2017.01)
*H01L 29/49* (2006.01)
*H01L 21/768* (2006.01)
*H01L 27/11582* (2017.01)

(52) U.S. Cl.
CPC .. *H01L 27/11524* (2013.01); *H01L 21/76829* (2013.01); *H01L 21/76832* (2013.01); *H01L 27/11582* (2013.01); *H01L 29/4991* (2013.01); *H01L 21/7682* (2013.01); *H01L 21/76805* (2013.01); *H01L 21/76807* (2013.01)

(58) Field of Classification Search
CPC .................................................. H01L 27/11524
USPC .......................................................... 257/321
See application file for complete search history.

(56) References Cited

U.S. PATENT DOCUMENTS

| 6,917,072 | B2 | 7/2005 | Noguchi et al. |
| 7,629,638 | B2 | 12/2009 | Yaegashi |
| 7,868,376 | B2 | 1/2011 | Aoyama et al. |
| 2006/0258164 | A1* | 11/2006 | Manning ............... H01L 27/105 438/740 |
| 2009/0035906 | A1* | 2/2009 | Lee ....................... H01L 21/324 438/264 |

FOREIGN PATENT DOCUMENTS

| JP | 3987418 | 10/2007 |
| JP | 2009-212218 | 9/2009 |
| JP | 4528700 | 8/2010 |

* cited by examiner

*Primary Examiner* — Hsin Yi Hsieh
(74) *Attorney, Agent, or Firm* — Oblon, McClelland, Maier & Neustadt, L.L.P.

(57) ABSTRACT

A semiconductor storage device according to an embodiment includes a plurality of memory cells, a first film, and a second film. The memory cells are placed at intervals in a first direction on a semiconductor substrate. The first film is placed continuously in the first direction above the memory cells so as to cover all of the memory cells and including mainly metal oxide. The second film is placed on the first film and including mainly silicon nitride or silicon dioxide.

2 Claims, 6 Drawing Sheets

SEMICONDUCTOR STORAGE DEVICE AND MANUFACTURING METHOD THEREOF

CROSS REFERENCE TO RELATED APPLICATIONS

This application is based upon and claims the benefit of priority from the prior U.S. Provisional Patent Application No. 62/215,496 filed on Sep. 8, 2015, the entire contents of which are incorporated herein by reference.

FIELD

Embodiments relate to a semiconductor storage device and a manufacturing method thereof.

BACKGROUND

In a manufacturing process of a NAND flash memory, a silicon nitride film is formed above memory cells and selection gates formed on a wafer. Trenches or holes for contact plugs that connect the selection gates to source lines or bit lines are formed by RIE (Reactive Ion Etching) using the silicon nitride film as a stopper film. Contact plugs are embedded in the formed trenches or holes with barrier metal interposed therebetween.

However, in the conventional manufacturing process, active hydrogen is generated in a silicon nitride film at a heat treatment step for a wafer after formation of the silicon nitride film and the generated active hydrogen reaches a tunnel oxide film, which deteriorates the tunnel oxide film.

Therefore, there has been a demand for suppression in deterioration of the memory cells due to active hydrogen and improvement in reliability of the memory cells.

DETAILED DESCRIPTION

A semiconductor storage device according to an embodiment includes a plurality of memory cells, a first film, and a second film. The memory cells are placed at intervals in a first direction on a semiconductor substrate. The first film is placed continuously in the first direction above the memory cells so as to cover all of the memory cells and comprising mainly metal oxide. The second film is placed on the first film and comprising mainly silicon nitride or silicon dioxide.

Embodiments will now be explained with reference to the accompanying drawings. The present invention is not limited to the embodiments.

(First Embodiment)

As a first embodiment, an embodiment of a semiconductor storage device that includes an alumina film in contact with a first insulating film and a second insulating film between the first insulating film and the second insulating film is explained.

Figure 1:
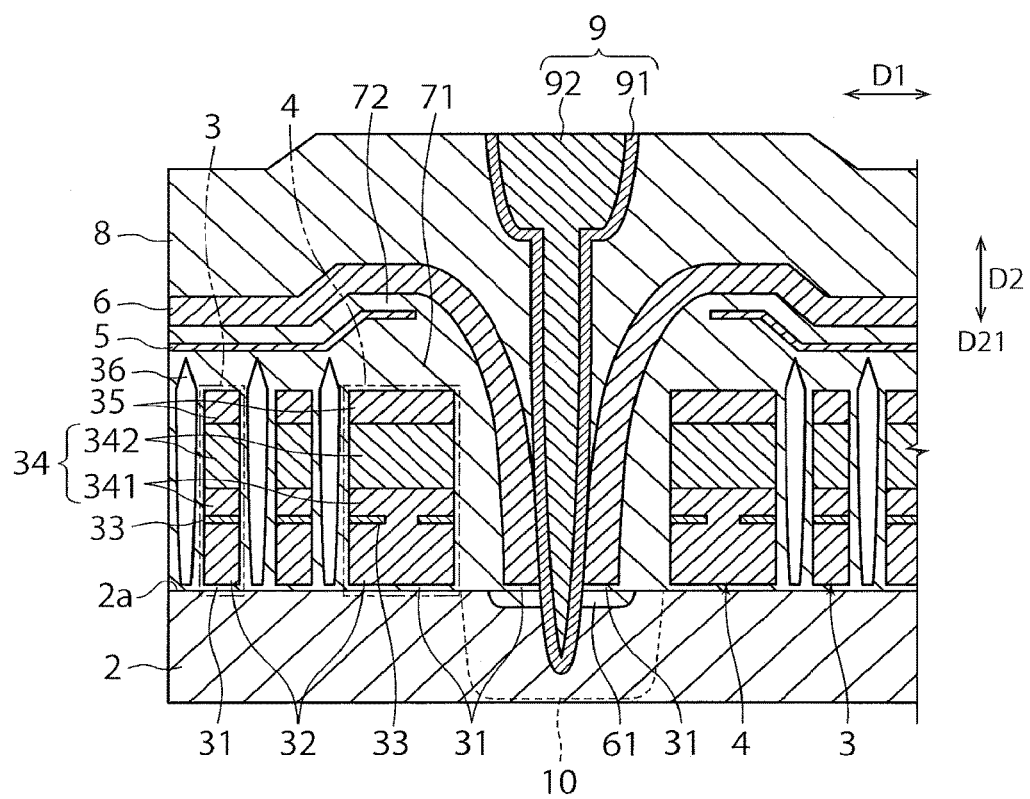
FIG. 1 is a sectional view showing a semiconductor storage device according to a first embodiment.

FIG. 1 is a sectional view showing a semiconductor storage device 1 according to the first embodiment. The semiconductor storage device 1 in FIG. 1 is a NAND flash memory.

As shown in FIG. 1, the semiconductor storage device 1 includes a semiconductor substrate 2, memory cells 3, selection gates 4, an alumina ($Al_2O_3$) film 5, and a silicon nitride film 6. The alumina film 5 is an example of a first film composed mainly of metal oxide. The silicon nitride film 6 is an example of a second film composed mainly of silicon nitride ($Si_3N_4$). As shown in FIG. 1, the semiconductor storage device 1 further includes a first insulating film 71, a second insulating film 72, an interlayer dielectric film 8, and contact plugs 9.

The memory cells 3 are placed on the upper face of the semiconductor substrate 2 at predetermined intervals in a first direction D1. The first direction D1 (hereinafter, also "bit-line direction") is parallel with the extending direction of bit lines (not shown).

The memory cells 3 each include a tunnel oxide film 31 or a gate oxide film, a floating gate 32, an interpoly dielectric film 33 having an ONO (a silicon oxide film/a silicon nitride film/a silicon oxide film) structure, and a control gate 34 or a word line in this order from the semiconductor substrate 2. A perpendicular direction (hereinafter, also "word-line direction") to the sheet of FIG. 1 is parallel with the extending direction of the word lines. The control gate 34 includes a polysilicon film 341 that is a lower layer and a tungsten film 342 that is an upper layer. A cap film 35 that has been used for forming the control gate 34 is placed on the upper face of the control gate 34. To reduce a parasitic capacitance between the fine memory cells 3 and suppress wiring delay, there are air gaps 36 between the memory cells 3 adjacent to each other.

Each of the selection gates 4 is placed on the upper face of the semiconductor substrate 2 at an interval from corresponding one of the memory cells 3 in the bit-line direction D1. More specifically, the selection gates 4 each include the tunnel oxide film 31, the floating gate 32, the interpoly dielectric film 33, the control gate 34 or a selection gate line, and the cap film 35 in this order from the semiconductor substrate 2. The floating gate 32 is electrically connected to the control gate 34.

A predetermined number of the memory cells 3 adjacent to each other in the bit-line direction D1, one selection gate 4 that is adjacent to one end of the relevant memory cells 3, and one selection gate 4 that is adjacent to the other end of the relevant memory cells 3 are connected in series and form a NAND string. One of the two selection gates 4 included in a NAND string connects the NAND string to a bit line, and the other selection gate 4 connects the NAND string to a source line. A plurality of NAND strings are placed at intervals in the bit-line direction and the word-line direction on the semiconductor substrate 2.

FIG. 1 shows two NAND strings adjacent to each other in the bit-line direction. In FIG. 1, two selection gates 4 adjacent to each other are the selection gates 4 at the source line side and connect the NAND strings to the source lines, respectively. Selection gates at the bit line side that connect the NAND strings to the bit lines have the same configuration as that in FIG. 1. The first insulating film 71 is in contact with the memory cells 3 and the selection gates 4 on the memory cells 3 and the selection gates 4. For example, the first insulating film 71 is a silicon oxide film.

The alumina film 5 is placed above the memory cells 3 and the selection gates 4 so as to contact with the first insulating film 71 on the first insulating film 71. More specifically, one of portions of the alumina film 5 is placed above one NAND string, that is, a plurality of the memory cells 3 and the selection gates 4 continuously in the bit-line direction D1 to cover the whole of the NAND string from above. In other words, the alumina film 5 extends from one end to the other end of one NAND string. Alternatively, one of portions of the alumina film 5 can be placed continuously in the word-line direction to cover a plurality of NAND strings adjacent to each other in the word-line direction from above.

The alumina film 5 can trap active hydrogen that is generated in layers upper than the alumina film 5 and that moves toward the memory cells 3. The alumina film 5 prevents active hydrogen from reaching the memory cells 3 because the alumina film 5 can trap the active hydrogen. Deterioration of constituent parts (for example, the tunnel oxide film 31) of the memory cells 3 by the active hydrogen can thereby be suppressed. The alumina film 5 can also trap active hydrogen from a silicon nitride film formed on the interlayer dielectric film 8 at a back-end step. The alumina film 5 can also trap active hydrogen from a silicon dioxide film as a layer upper than the alumina film 5.

A film composed mainly of metal oxide other than alumina can alternatively be used as the first film as long as the film can suppress deterioration in the characteristics (for example, data-writing or erasing characteristics) of the memory cells 3 due to active hydrogen. The metal oxide can be oxide of at least one element of Al, Hf, Ti, Ta, Nb, Ce, La, Y, and Zr or compound oxide of the at least one element and silicon dioxide.

The second insulating film 72 is in contact with the alumina film 5 on the alumina film 5. For example, the second insulating film 72 is a silicon oxide film.

The silicon nitride film 6 is in contact with the second insulating film 72 on the second insulating film 72. The silicon nitride film 6 is formed to extend from the upper side of the second insulating film 72 to the contact plugs 9 on the semiconductor substrate 2 passing through side walls of the first insulating film 71. The silicon nitride film 6 is used as an etching stopper in processing the contact plugs 9.

Heat treatment of the semiconductor substrate 2 after formation of the silicon nitride film 6 generates active hydrogen in the silicon nitride film 6. Examples of the heat treatment include heating of the semiconductor substrate 2 to be performed for crystal recovery after formation of a diffusion layer 10 between the adjacent selection gates 4. Active hydrogen generated in the heat treatment moves toward the memory cells 3 downward D21. However, in the first embodiment, because the alumina film 5 placed downward D21 with respect to the silicon nitride film 6 can trap active hydrogen, deterioration in the characteristics of the memory cells 3 due to active hydrogen can be suppressed.

The interlayer dielectric film 8 is in contact with the silicon nitride film 6 on the silicon nitride film 6. The interlayer dielectric film 8 is a silicon oxide film.

Each of the contact plugs 9 penetrates the interlayer dielectric film 8 in a vertical direction D2 between two selection gates 4 at the source-line side that are adjacent to each other in the bit-line direction D1. The contact plugs 9 have a plate shape extending in the word-line direction. The lower ends of the contact plugs 9 reach the diffusion layer 10 in the semiconductor substrate 2. The contact plugs 9 each include a barrier metal 91 and a metal film 92. For example, the metal film 92 is a tungsten film. Contact plugs are also placed between two selection gates at the bit-line side that are adjacent to each other in the bit-line direction D1. The contact plugs at the bit-line side have a column shape.

Source lines (not shown) are provided on the upper ends of the contact plugs 9, respectively. The bit lines are provided on the upper ends of the contact plugs at the bit-line side, respectively. A multilayer wiring layer (not shown) is provided on the interlayer dielectric film 8.

Figure 2:
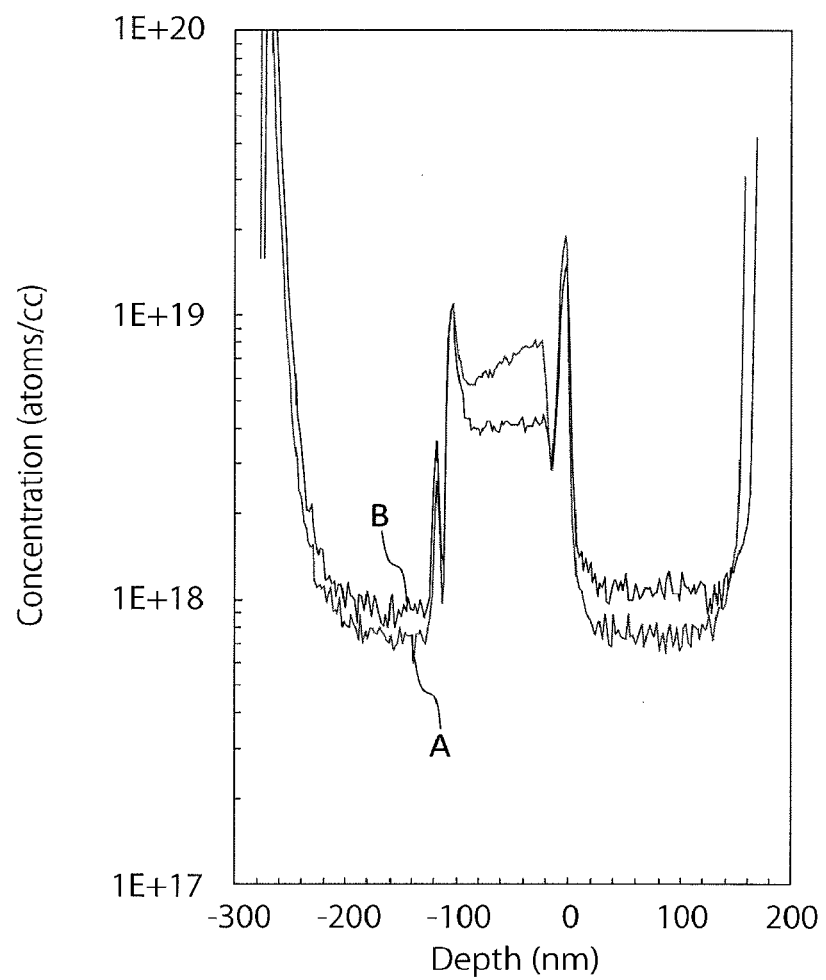
FIG. 2 is a graph showing characteristics of the semiconductor storage device according to the first embodiment.

An example of an experiment in which the characteristics of the semiconductor storage device 1 in FIG. 1 were studied is explained next. FIG. 2 is a graph showing the characteristics of the semiconductor storage device 1 according to the first embodiment. FIG. 2 shows a result of profiling the concentration of hydrogen (the vertical axis) relative to the depths of samples (the horizontal axis) by SIMS (Secondary Ion Mass Spectrometry) for a first sample including an alumina film and a second sample including no alumina film. The first sample was obtained by stacking a silicon oxide film corresponding to a tunnel oxide film, a polysilicon film, a silicon oxide film, an alumina film, and a silicon nitride film in this order on a semiconductor substrate and thereafter performing the above-mentioned heat treatment for crystal recovery. The second sample was obtained by removing the alumina film from the first sample.

In FIG. 2, "0 nanometer" on the horizontal axis indicates an interface between the tunnel oxide film and the polysilicon film located on the tunnel oxide film. In FIG. 2, "−100 nanometers" on the horizontal axis indicates an interface between the tunnel oxide film and the semiconductor substrate located under the tunnel oxide film.

As shown in FIG. 2, the concentration of hydrogen in a profiling result (A) in a case where an alumina film was included is lower than that in a profiling result (B) in a case where no alumina film was included. This measurement result indicates that the alumina film can suppress increase in the concentration of hydrogen in the tunnel oxide film caused by the silicon nitride film. That is, FIG. 2 indicates that the semiconductor storage device 1 including the alumina film 5 according to the first embodiment can suppress deterioration in the characteristics of the memory cells 3 due to active hydrogen.

Therefore, the semiconductor storage device 1 according to the first embodiment can suppress deterioration in the characteristics of the memory cells 3 due to active hydrogen and improve the reliability of the memory cells 3.

(Manufacturing Method)

A manufacturing method of the semiconductor storage device 1 in FIG. 1 is explained next.

Figures 3A, 3B, 3C, 3D:
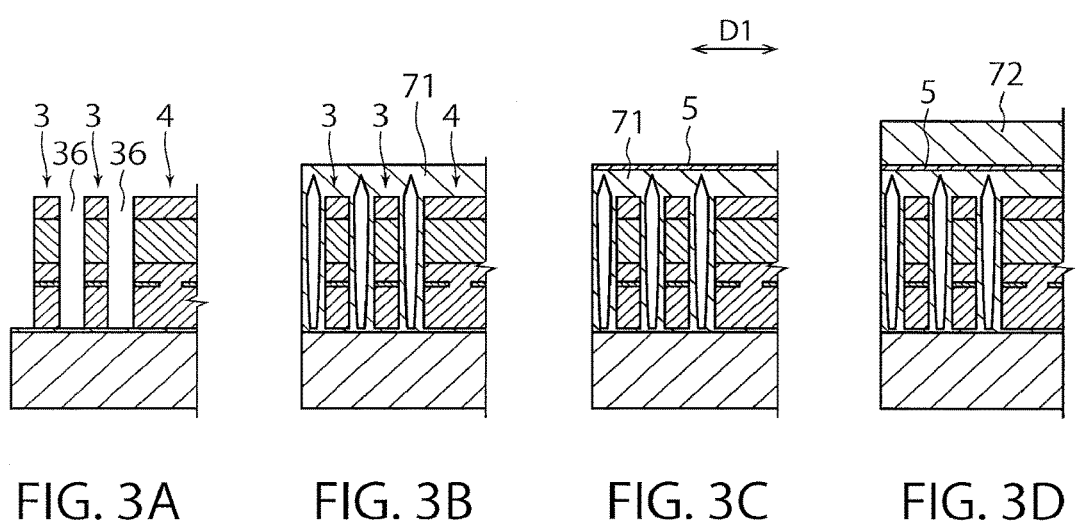
FIG. 3A is a sectional view showing a manufacturing method of the semiconductor storage device according to the first embodiment.
FIG. 3B is a sectional view showing a manufacturing method following FIG. 3A.
FIG. 3C is a sectional view showing a manufacturing method following FIG. 3B.
FIG. 3D is a sectional view showing a manufacturing method following FIG. 3C.

FIG. 3A is a sectional view showing a step of forming the memory cells 3 and the selection gates 4 in a manufacturing method of a semiconductor storage device according to the first embodiment. First, the tunnel oxide film 31, a polysilicon film for the floating gate 32, the interpoly dielectric film 33, a polysilicon film and a tungsten film for the control gate 34, and the cap film 35 are stacked in this order on the semiconductor substrate 2. Thereafter, as shown in FIG. 3A, the memory cells 3 and the selection gates 4 are formed, that is, separated from each other. For example, the memory cells 3 and the selection gates 4 can be formed by a photolithography method and an RIE method.

When the memory cells 3 and the selection gates 4 are formed, the air gaps 36 separate the adjacent memory cells 3 or the memory cell 3 and the selection gate 4 that are adjacent to each other. Transistors around NAND strings can be formed simultaneously with the memory cells 3 and the selection gates 4.

FIG. 3B is a sectional view showing a step of forming the first insulating film 71, which is a manufacturing method following FIG. 3A. As shown in FIG. 3B, after the memory cells 3 and the selection gates 4 are formed, the first insulating film 71 is formed on the memory cells 3 and the selection gates 4. For example, the first insulating film 71 can be formed by a plasma CVD (Chemical Vapor Deposition) method.

FIG. 3C is a sectional view showing a step of forming the alumina film 5, which is a manufacturing method following FIG. 3B. As shown in FIG. 3C, after the first insulating film 71 is formed, the alumina film 5 is formed on the first insulating film 71. In this case, the alumina film 5 is formed continuously in the bit-line direction D1 so as to entirely cover the NAND strings from above. Alternatively, the alumina film 5 can be formed continuously in the word-line direction so as to entirely cover a plurality of NAND strings adjacent to each other in the word-line direction. In the first embodiment, the alumina film 5 is preferably formed by a sputtering method. The alumina film 5 formed by a sputtering method has a high film density. The alumina film 5 having a high film density can provide a good blocking effect (trapping effect) to active hydrogen resulting from films upper than the alumina film 5. In the sputtering method, gas containing hydrogen is not used. Accordingly, the alumina film 5 itself can be prevented from containing hydrogen when the alumina film 5 is formed. Therefore, the characteristics of the memory cells 3 can be prevented from being deteriorated due to activation of hydrogen in the alumina film 5 itself. The film thickness of the alumina film 5 can be 3 nanometers or more.

FIG. 3D is a sectional view showing a step of forming the second insulating film 72, which is a manufacturing method following FIG. 3C. As shown in FIG. 3D, after the alumina film 5 is formed, the second insulating film 72 is formed on the alumina film 5. For example, the second insulating film 72 can be formed by the plasma CVD method.

Figure 4A:
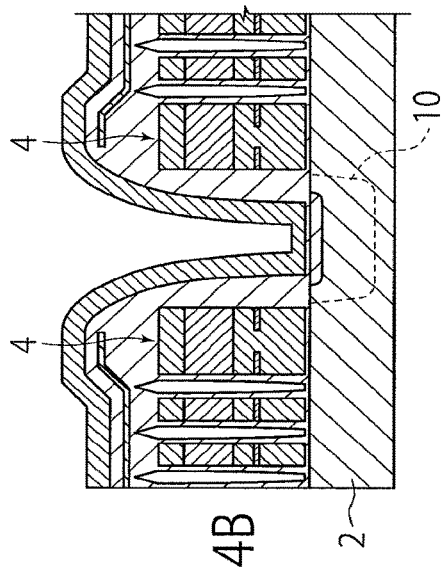
FIG. 4A is a sectional view showing a manufacturing method of the semiconductor storage device according to the first embodiment following FIG. 3D.

FIG. 4A is a sectional view showing a step of forming the silicon nitride film 6, which is a manufacturing method following FIG. 3D. As shown in FIG. 4A, after the second insulating film 72 is formed, the silicon nitride film 6 is formed on the second insulating film 72. For example, the silicon nitride film 6 can be formed by an LP (Low Pressure) CVD method. Raw material gas of the silicon nitride film 6 includes hydrogen gas. In forming the silicon nitride film 6, the first insulating film 71, the second insulating film 72, and the alumina film 5 that are located at positions (positions of the contact plugs 9, which will be described later) between NAND strings adjacent to each other in the bit-line direction D1 can be removed by the photolithography or RIE method.

Figure 4B:
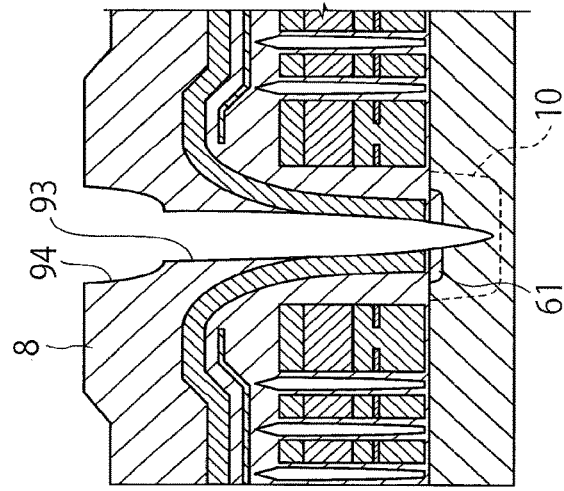
FIG. 4B is a sectional view showing a manufacturing method following FIG. 4A.

FIG. 4B is a sectional view showing a step of forming the diffusion layer 10 between the selection gates 4, which is a manufacturing method following FIG. 4A. As shown in FIG. 4B, after the silicon nitride film 6 is formed, the diffusion layer 10 is formed between the respective selection gates 4 of the NAND strings adjacent to each other on the semiconductor substrate 2. The diffusion layer 10 can be formed by implanting impurity ions.

After the diffusion layer 10 is formed, the semiconductor substrate 2 is thermally treated for crystal recovery. The silicon nitride film 6 is formed with use of hydrogen gas. Accordingly, the silicon nitride film 6 contains hydrogen from start of formation of the silicon nitride film 6. The silicon nitride film 6 generates active hydrogen during the heat treatment because the silicon nitride film 6 contains hydrogen. The generated active hydrogen moves toward the memory cells 3. However, the active hydrogen moving toward the memory cells 3 is trapped by the alumina film 5 and thus hardly reaches the memory cells 3. In this manner, deterioration in the characteristics of the memory cells 3 due to active hydrogen can be suppressed.

Figure 4C:
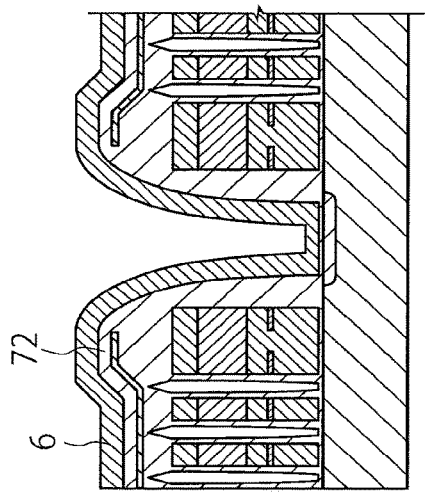
FIG. 4C is a sectional view showing a manufacturing method following FIG. 4B.

FIG. 4C is a sectional view showing a step of forming the interlayer dielectric film 8, which is a manufacturing method following FIG. 4B. As shown in FIG. 4C, after the diffusion layer 10 is formed, the interlayer dielectric film 8 is formed on the silicon nitride film 6. For example, the interlayer dielectric film 8 can be formed by a CVD method.

Figure 4D:
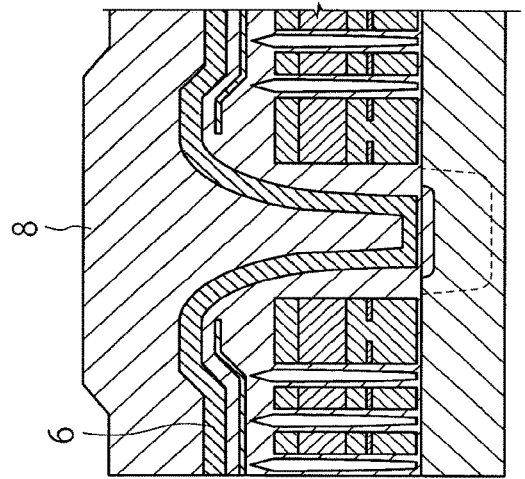
FIG. 4D is a sectional view showing a manufacturing method following FIG. 4C.

FIG. 4D is a sectional view showing a step of forming trenches for the contact plugs 9, which is a manufacturing method following FIG. 4C. As shown in FIG. 4D, after the interlayer dielectric film 8 is formed, trenches 93 for the contact plugs 9 are formed in the interlayer dielectric film 8. The trenches 93 are formed by the RIE method. At that time, first RIE is stooped at an upper portion of a linear silicon nitride film 61 using the silicon nitride film 6 as an etching stopper. The first RIE is performed under a condition where the silicon nitride film 61 is less likely to be etched. Subsequently, after grooves 94 for upper-part wiring are formed in the trenches 93, respectively, the trenches 93 are further dug to the diffusion layer 10 in second RIE. In forming the trenches 93, holes for contact plugs at the bit-line side may be formed between the selection gates at the bit-line side.

Thereafter, after the barrier metal 91 is formed in the trenches 93, the metal film 92 is embedded therein. Thereby, the semiconductor storage device 1 in FIG. 1 is provided.

With the manufacturing method of the semiconductor storage device 1 according to the first embodiment, the alumina film 5 is formed between the first insulating film 71 and the second insulating film 72. Therefore, deterioration in the characteristics of the memory cells 3 due to active hydrogen generated in the silicon nitride film 6 on the second insulating film 72 can be suppressed.

(Second Embodiment)

Figure 5:
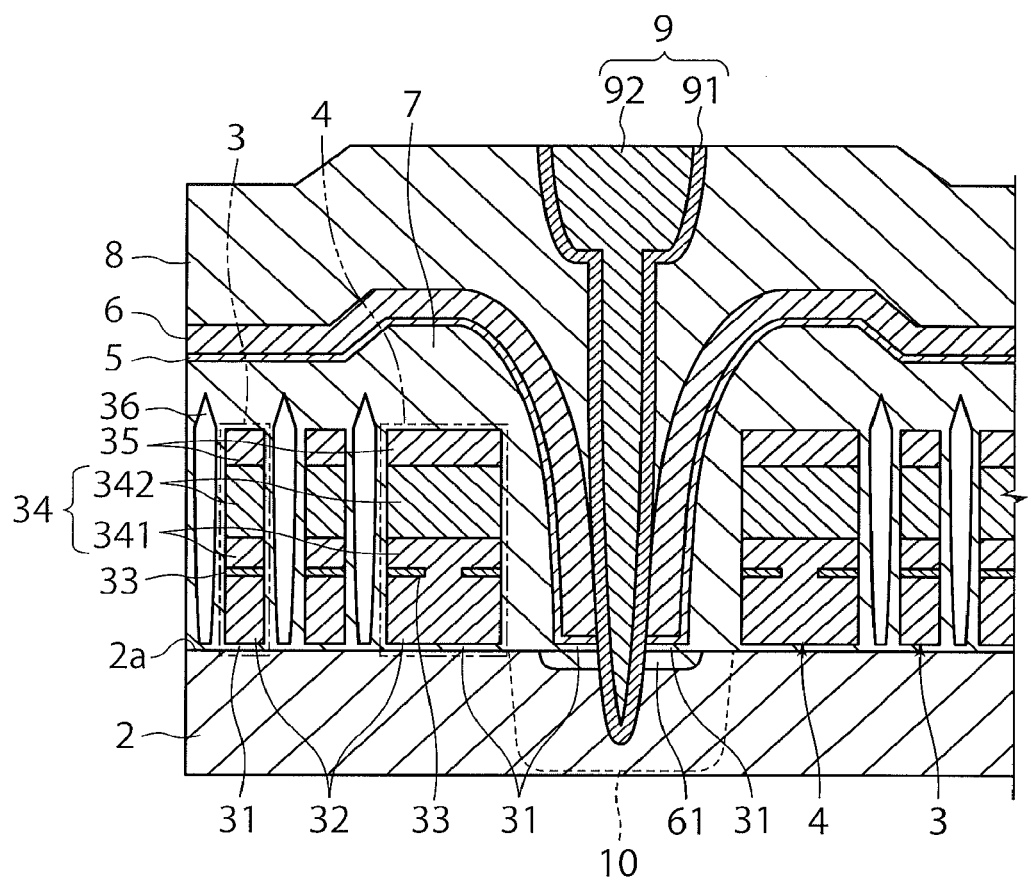
FIG. 5 is a sectional view showing a semiconductor storage device according to a second embodiment.

An embodiment of a semiconductor storage device that includes an alumina film in contact with an insulating film and a silicon nitride film between the insulating film and the silicon nitride film is explained next as a second embodiment. In the second embodiment, constituent elements corresponding to those in the first embodiment are denoted by like reference characters and redundant explanations thereof will be omitted. FIG. 5 is a sectional view showing the semiconductor storage device 1 according to the second embodiment.

The alumina film 5 according to the first embodiment is placed between the first insulating film 71 and the second insulating film 72 so as to contact with the first insulating film 71 and the second insulating film 72.

On the other hand, the alumina film 5 according to the second embodiment is placed between an insulating film 7 and the silicon nitride film 6 so as to contact with the insulating film 7 and the silicon nitride film 6. The insulating film 7 is in contact with the memory cells 3 on the memory cells 3. Portions of the alumina film 5 according to the second embodiment are placed continuously to extend from the upper sides of the NAND strings to the positions of the contact plugs 9 on the semiconductor substrate 2, respectively.

That is, the alumina film 5 according to the second embodiment is placed on an interface between the insulating film 7 and the silicon nitride film 6 so as to cover the whole of respective NAND stings from the upper and lateral sides. The alumina film 5 according to the second embodiment is preferably formed by an ALD (Atomic Layer Deposition) method. As raw material gas in the ALD method, organic source gas such as TMA (trimethylaluminium) and $O_3$ gas can be suitably used. The film thickness of the alumina film 5 can be 3 nanometers or more.

The alumina film 5 formed by the ALD method has a high coverage property. The alumina film 5 can cover the whole of the respective NAND strings stably due to the high coverage property. For this reason, the alumina film 5 can trap not only active hydrogen that attempts to intrude into the NAND strings from the respective upper sides of the NAND strings but also active hydrogen that attempts to intrude into the NAND strings from the respective lateral sides of the selection gates 4.

According to the second embodiment, the alumina film 5 covering the whole of the respective NAND strings is provided. Consequently, deterioration in the characteristics of the memory cells 3 due to active hydrogen can be suppressed more effectively and the reliability of the memory cells 3 can be improved more.

(Third Embodiment)

Figure 6:
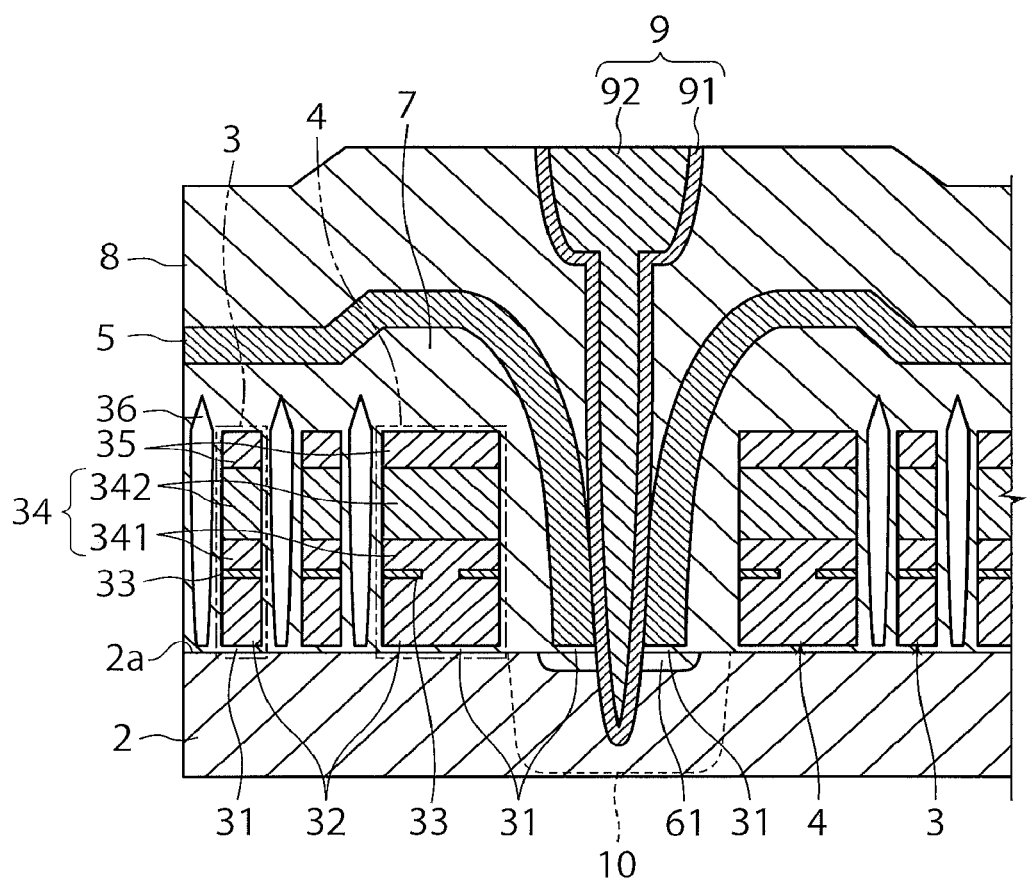
FIG. 6 is a sectional view showing a semiconductor storage device according to a third embodiment.

An embodiment of a semiconductor storage device that includes an alumina film as an etching stopper film for contact plugs is explained next as a third embodiment. In the third embodiment, constituent elements corresponding to those in the first embodiment are denoted by like reference characters and redundant explanations thereof will be omitted. FIG. 6 is a sectional view showing the semiconductor storage device 1 according to the third embodiment. As shown in FIG. 6, portions of the alumina film 5 according to the third embodiment are placed continuously to extend from the upper sides of the NAND strings to the positions of the contact plugs 9 on the semiconductor substrate 2, respectively. The alumina film 5 according to the third embodiment is an etching stopper film for the contact plugs 9.

In manufacturing the semiconductor storage device 1 according to the third embodiment, the alumina film 5 is formed so as to extend from the upper sides of the NAND strings to the positions where the contact plugs 9 are to be formed on the semiconductor substrate 2 (a substrate surface). After the alumina film 5 is formed, the trenches 93 (see FIG. 4D) are formed so as to penetrate the alumina film 5 by two times of RIE at the positions where the contact plugs 9 are to be formed. In the first RIE, the alumina film 5 functions as a stopper film and the lower ends of the trenches 93 are stopped by the aluminum film 5. In the second RIE, the trenches 93 penetrate the alumina film 5. After the trenches 93 are formed, the contact plugs 9 are embedded in the trenches 93.

The alumina film 5 according to the third embodiment is preferably formed by the ALD method using an inorganic source such as $AlCl_3$ (trichloroaluminum) and $O_3$ as raw material gas, for example. The film thickness of the aluminum film 5 can be 20 nanometers or more. When the alumina film 5 is formed to have a certain thickness, the alumina film can function properly as an etching stopper film.

The alumina film 5 formed by the ALD method has a high coverage property similarly in the second embodiment. Accordingly, the alumina film 5 can cover the whole of the NAND strings from the upper and lateral sides of the NAND strings to suppress deterioration of the memory cells 3 due to active hydrogen more effectively. The alumina film 5 according to the third embodiment traps active hydrogen generated in films (for example, a silicon oxide film that is an example of the first film composed mainly of silicon dioxide, or a silicon nitride film) upper than the alumina film 5.

In the third embodiment, the alumina film 5 that has a relatively large thickness is used. However, by using an inorganic source as raw material gas, deterioration in the characteristics of the memory cells 3 caused by activation of hydrogen included in the alumina film 5 itself can also be suppressed.

According to the third embodiment, the alumina film 5 also serves as the etching stopper film for contact plugs. Consequently, while the film forming step is simplified, deterioration of the memory cells 3 due to active hydrogen can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of memory cells placed at intervals in a first direction on a semiconductor substrate;
selection gates placed at intervals from the memory cells in the first direction on the semiconductor substrate;
an insulating film placed above the memory cells and the selection gates;
a metal oxide film placed continuously in the first direction above the memory cells and the selection gates so as to cover the memory cells and the selection gates, the metal oxide film being on the insulating film, and the metal oxide film comprising mainly metal oxide;
an interlayer dielectric film placed on the metal oxide film; and
contact plugs placed at intervals from the selection gates in the first direction on the semiconductor substrate and connecting the selection gates to signal lines, respectively, wherein
the metal oxide film is located from an upper side of the memory cells to positions of the contact plugs on the semiconductor substrate, and the metal oxide film is used as an etching stopper for processing the contact plugs,
the metal oxide film is provided around trenches of the interlayer dielectric film, with the contact plugs provided in the trenches, is in contact with a lower portion of the contact plugs, and is formed directly on a tunnel oxide film around areas where the contact plugs are in contact with the semiconductor substrate, and
the metal oxide film is provided apart from a silicon nitride film formed directly on a diffusion layer provided in the semiconductor substrate.

2. The device of claim 1, wherein the metal oxide film has oxide of at least one element of Al, Hf, Ti, Ta, Nb, Ce, La, Y, and Zr, or compound oxide of the at least one element and silicon dioxide.

\* \* \* \* \*